United States Patent
Hattendorf et al.

(10) Patent No.: US 7,413,639 B2
(45) Date of Patent: Aug. 19, 2008

(54) ENERGY AND MEDIA CONNECTION FOR A COATING INSTALLATION COMPRISING SEVERAL CHAMBERS

(75) Inventors: Guido Hattendorf, Brachttal (DE); Gert Rödling, Obertshausen (DE); Gerhard Rist, Langenselbold (DE)

(73) Assignee: Applied Materials GmbH & Co. KG, Alzenau (DE)

( * ) Notice: Subject to any disclaimer, the term of this patent is extended or adjusted under 35 U.S.C. 154(b) by 757 days.

(21) Appl. No.: 10/855,874

(22) Filed: May 26, 2004

(65) Prior Publication Data

US 2005/0183943 A1 Aug. 25, 2005

(30) Foreign Application Priority Data

Feb. 9, 2004 (DE) .................... 10 2004 006 419

(51) Int. Cl.
*C23C 14/35* (2006.01)
*C23C 16/00* (2006.01)

(52) U.S. Cl. .............. 204/298.25; 204/298.03; 204/298.07; 204/298.08; 204/298.09; 204/298.33; 204/298.34; 204/298.35; 118/719; 156/345.33; 156/345.37; 156/345.31

(58) Field of Classification Search ........... 204/298.03, 204/298.07, 298.08, 298.09, 298.25, 298.33, 204/298.34, 298.35; 118/719; 156/345.33, 156/345.37, 345.31
See application file for complete search history.

(56) References Cited

U.S. PATENT DOCUMENTS

| | | | |
|---|---|---|---|
| 4,483,362 A | | 11/1984 | Luginbuhl |
| 4,722,298 A | * | 2/1988 | Rubin et al. ............. 118/715 |
| 5,364,219 A | * | 11/1994 | Takahashi et al. ......... 414/217 |
| 5,972,184 A | | 10/1999 | Hollars et al. |
| 6,235,171 B1 | * | 5/2001 | Yamamoto ........... 204/298.25 |
| 6,598,279 B1 | * | 7/2003 | Morgan ............... 29/402.08 |
| 2003/0085114 A1 | | 5/2003 | Johnson et al. |
| 2003/0150712 A1 | | 8/2003 | Reiter et al. |

FOREIGN PATENT DOCUMENTS

| | | |
|---|---|---|
| DE | 197 43 800 C1 | 10/1997 |
| DE | 198 50 415 C1 | 11/1998 |
| DE | 102 05 167 C1 | 8/2003 |
| EP | 0 089 384 A1 | 9/1983 |
| EP | 0 899 357 B1 | 3/1999 |

* cited by examiner

*Primary Examiner*—Rodney G McDonald
(74) *Attorney, Agent, or Firm*—Fulbright & Jaworski L.L.P.

(57) ABSTRACT

The invention relates to an energy and media connection module for coating installations. Said module serves for supplying with cooling water, compressed air, process gases, signal, control and cathode power. It can be moved from one coating chamber to another coating chamber along a coating line by a single person in a short time. Further, it is possible to separate the energy connection module from a coating chamber for maintenance or displacement purposes without mechanically demounting all connections.

9 Claims, 7 Drawing Sheets

ENERGY AND MEDIA CONNECTION FOR A COATING INSTALLATION COMPRISING SEVERAL CHAMBERS

FIELD OF THE INVENTION

This application claims priority from German Patent Application 10 2004 006 419.9 filed Feb. 9, 2004, which is hereby incorporated by reference in its entirety.

The invention relates to an energy and media connection.

BACKGROUND AND SUMMARY OF THE INVENTION

Coating installations, for example for glass, often comprise a cathode and an anode, between which a voltage generating a plasma obtains. With the aid of this plasma certain substances are deposited on the glass, be that by sputtering or another method. During sputtering, the cathode is strongly heated since positively charged particles impinge out of the plasma onto a target connected with the cathode and knock atoms or molecules out of it, which subsequently become deposited on the glass.

To keep the heating of the cathode within limits, it is cooled and specifically, as a rule, with a fluid medium, for example water. For this purpose special water supply lines are required. Apart from these water supply lines, power supply lines are also required in order to be able to apply a specific voltage between cathode and anode. Moreover, gas supply lines are required in order to provide gases for generating the plasma or for a chemical reaction.

In conventional coating installations the different energy and media connections are tailored to the particular coatings to be produced. Consequently, cooling pipe supply lines and voltage supply lines are provided, which are laid out for the particular cathode utilized.

Similarly, special gas supply lines for reactive or non-reactive sputtering are disposed on the particular coating installation.

As a rule, a coating installation is comprised of several coating chambers, which are disposed adjacent to one another. If a sputter cathode is to be moved from one coating chamber into another coating chamber, the special supply lines must again be disposed on the new coating chamber by welding, etc. This adaptation of a coating chamber to a new cathode entails very high expenditures.

The invention therefore addresses the problem of providing an energy and media connection for coating installations, which does not require individual adaptation to the particular coating chamber.

This problem is solved according to the present invention.

The advantage attained with the invention comprises in particular that the time expenditure for the reconfiguration of coating installations is considerably reduced. In addition, mobile energy and media connection modules can be moved from one coating chamber to another coating chamber by a single person in a short time and without major auxiliary resources. The maintenance of a coating chamber is also simplified, since the connection modules can be displaced away from this coating chamber.

An embodiment example of the invention is shown in the drawing and will be explained in the following in further detail.

DETAILED DESCRIPTION

Figure 1:
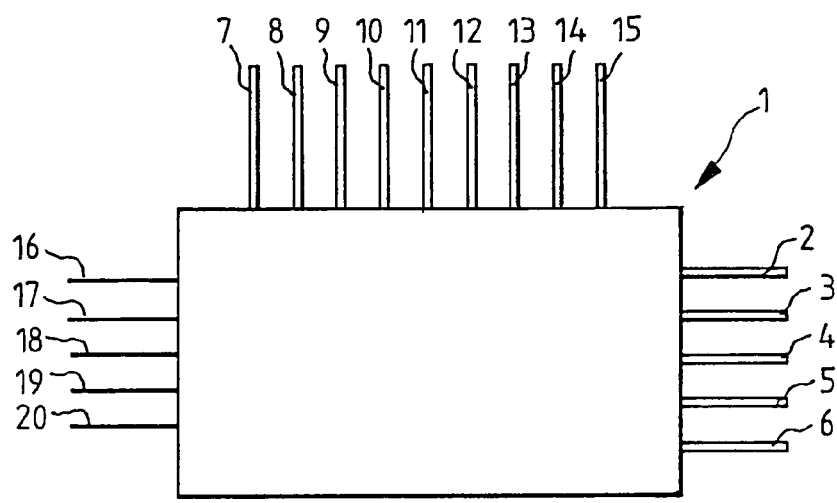
FIG. 1 fundamental diagram of a module for energy and media connections.

FIG. 1 shows a module 1 for energy and media connections in the form of a block. This module 1 comprises several cooling medium lines 2 to 6, for example a cooling medium line 2 for cooling a cathode with water and a cooling medium line 3 for cooling the environment of the cathode as well as a cooling medium line 4 for cooling the wall opposite the cathode. By 5 and 6 are denoted reserve cooling medium lines, which are required for cooling other structural parts in a coating installation.

In addition to the cooling medium lines 2 to 6, the module 1 also comprises gas supply lines 7 to 15. With the gas supply line 7 for example argon is introduced into the process or coating chamber, while with the gas supply line 8 nitrogen is supplied. The gas supply line 9 serves analogously for supplying oxygen. If needed, further gases can be introduced into the process chamber with gas supply lines 10 to 15. They can also serve as purging lines or compressed air lines.

Lines 16 to 20 are control lines and/or energy supply lines and/or measuring lines. For example, with line 16 voltage can be applied on the cathode, by which a plasma process is initiated. Line 17 can be provided for the regulation of voltage, current or electric power, and line 18 for the energy supply of a drive in the process chamber. With lines 19, 20 further structural elements can be supplied with electric energy or be controlled.

Module 1 comprises as many lines and connections as are maximally required for the supply of a process chamber. If some lines and connections are not required, they are switched idle. The connections from the outside to module 1 and from the module to a process chamber are implemented such that they are detachable.

Figure 2:
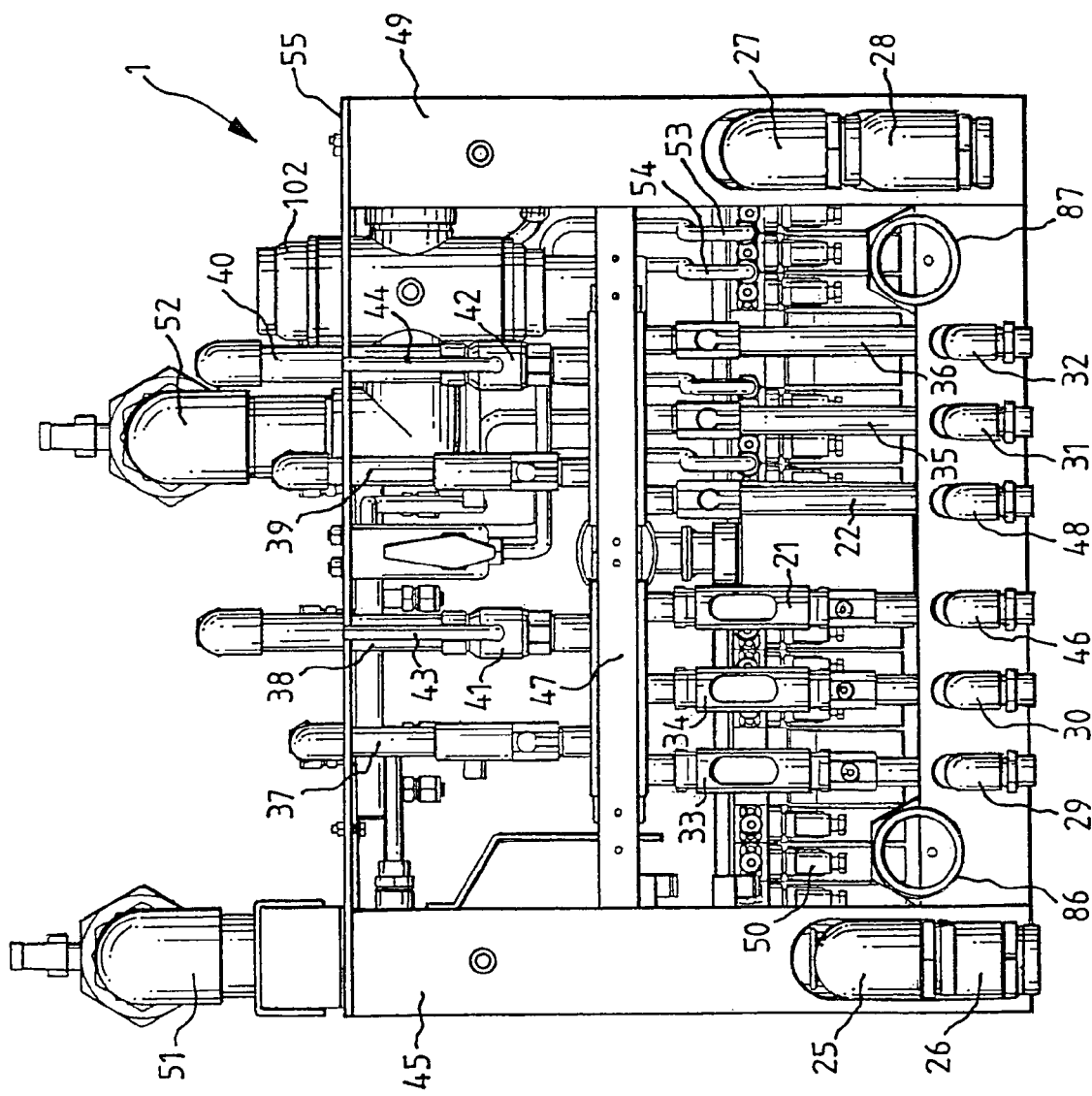
FIG. 2 front view of an energy and media connection module.

FIG. 2 shows a concrete module 1 in front view, which is developed as a framework structure. Evident herein are a cooling water return conduit 25 for a first cathode, a cooling water return conduit 26 for a second cathode, a cooling water forward conduit 27 for the first cathode and a cooling water forward conduit 28 for the second cathode. In addition, a connection 51 for the return conduit of the cathode cooling and a connection 52 for the forward conduit of the cathode cooling.

Since the environment of the cathodes is also cooled, three return conduit 29, 30, 46 and three forward conduits 48, 31, 32 for the environment cooling are provided. By 86 and 87 are denoted electric power connections. Above the return conduits 29, 30, 46 are located three throughflow monitors 33, 34, 21 and above the forward conduit 48, 31, 32 three pipelines 22, 35, 36. A connection for the water return conduit for the environment cooling is denoted by 38, with this return conduit being provided with a shutoff valve 41, which comprises a shutoff lever 43. A corresponding shutoff valve 42 with an associated shutoff lever 44 is disposed preceding the connection 40 for the water forward conduit for cooling the environment of a cathode. Between two metal sheets 45, 49 of the framework structure of module I is a transversely extending reinforcement metal sheet 47. Above this reinforcement metal sheet 47 a pressure reducer 102 is evident. The top of module 1 is denoted by 55.

Figure 3:
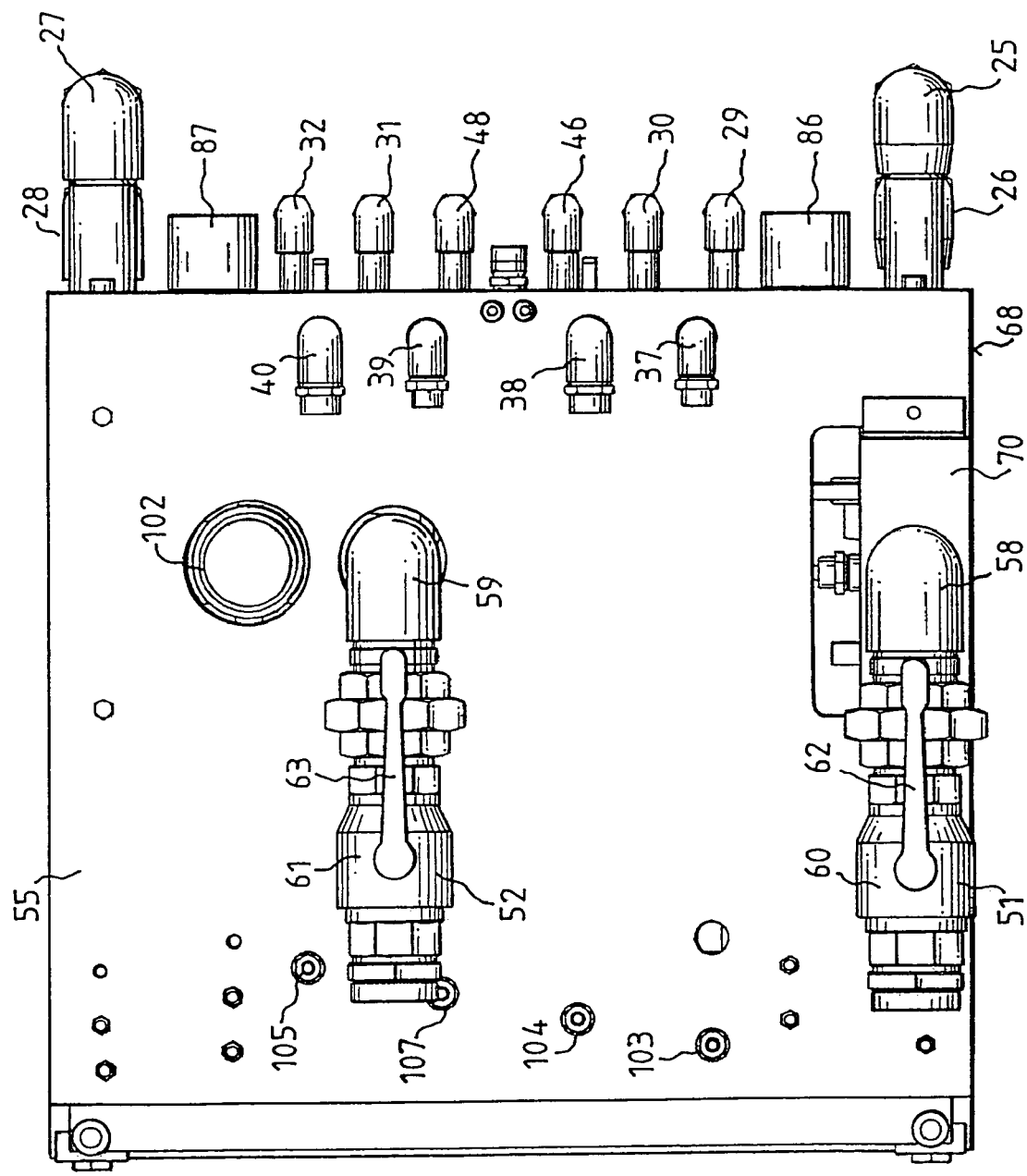
FIG. 3 view of the top of the module depicted in FIG. 2.

In FIG. 3 the top 55 of module 1 according to FIG. 2 is shown. Evident herein are again the return conduits 29, 30, 46 and the forward conduits 48, 31, 32 of the environment cooling as well as the cooling water connections 26 to 28 for cooling the two cathodes. Also evident are the electric power connections 86, 87. By 37 is denoted a purging line, which is located adjacent to the connection 38 for the water return conduit for cooling the cathode environment. A connection for compressed air 39 is located next to the connection 40 for the water forward conduit for the cooling. Adjoining a pipe elbow 58, which is disposed on a water manifold 70, is a shutoff device 60 with a shutoff lever 62, and adjoining the shutoff device 60 is the connection 51 for the return conduit of the cathode cooling. Opposite the pipe elbow 58 is a further pipe elbow 59, which is adjoined by a-shutoff device 61 with the shutoff lever 63. Onto the shutoff device 61 is flanged the connection 52 for the forward conduit of the cathode cooling. By 103, 104, 105, 107 are denoted gas connections, while 102 denotes the pressure reducer.

Figure 4:
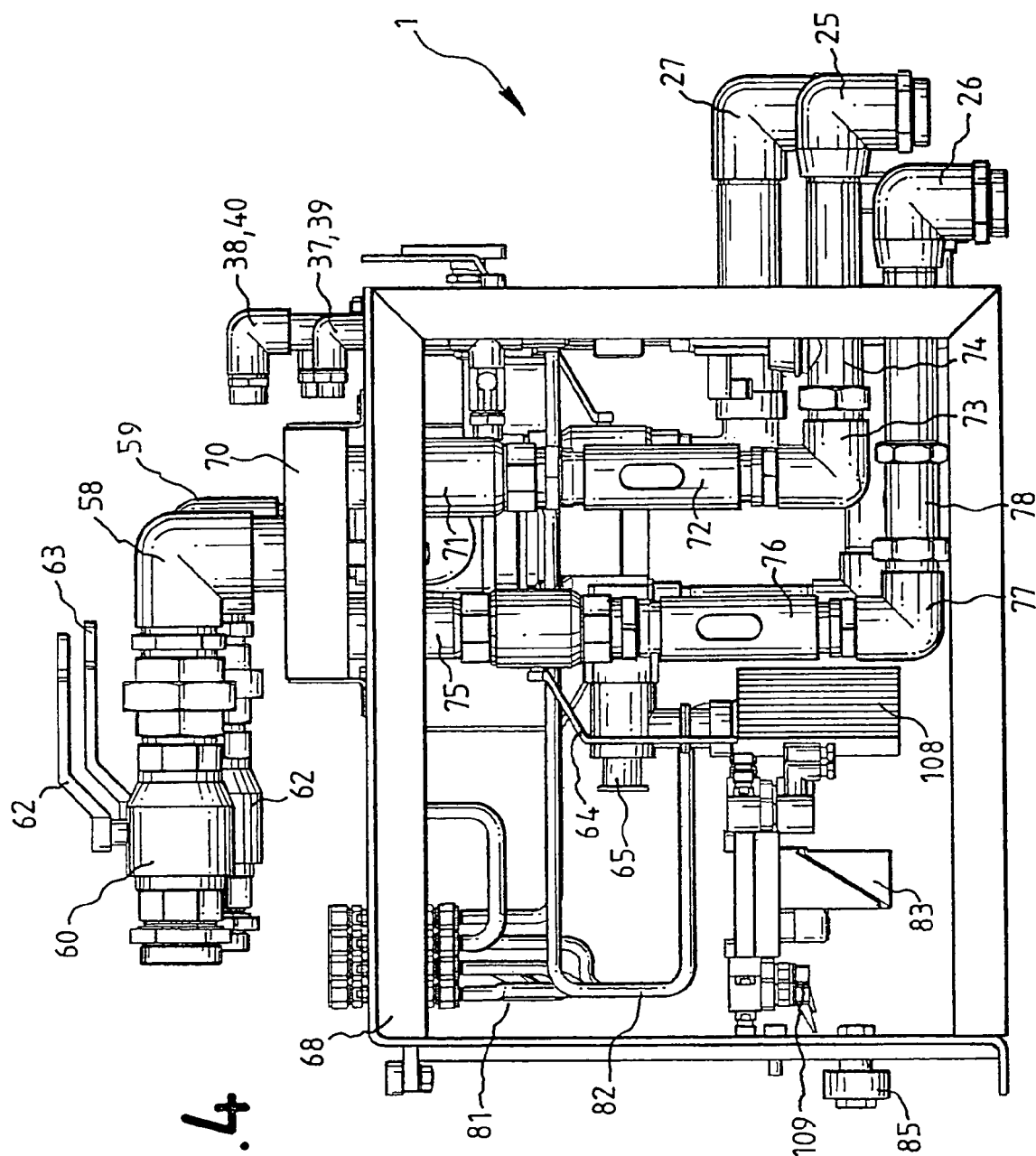
FIG. 4 side view of the module depicted in FIGS. 2 and 3.

In FIG. 4 the module 1 depicted in FIGS. 2 and 3 is shown again in a view onto the side 68. Evident are herein several gas lines 81, 82 of which the gas line 82 originates from a gas selection switch. A shutoff valve 75 and a throughflow monitor 76 can also be seen, with the throughflow monitor 76 leading via a pipe elbow 77 to a pipe 78, which is connected with the cooling water return conduit 26 for the second cathode. The throughflow monitor 72 is correspondingly connected via the pipe elbow 73 and pipe 74 with the cooling water return conduit 25 for the first cathode. With the throughflow monitor 72 is additionally connected a shutoff valve 71, which leads to the water manifold 70. Beneath a pressure meter 108 is located a gas flow regulator 83 and beneath it a manual gas valve 109. In the proximity of the shutoff lever 64 is provided a vacuum flange 65 for a flexible vacuum connection from the installation to the pressure meter 108. The throughflow monitor 72 and the pressure meter 108 as well as the gas flow regulator 83 are connected to a central control.

Figure 5:
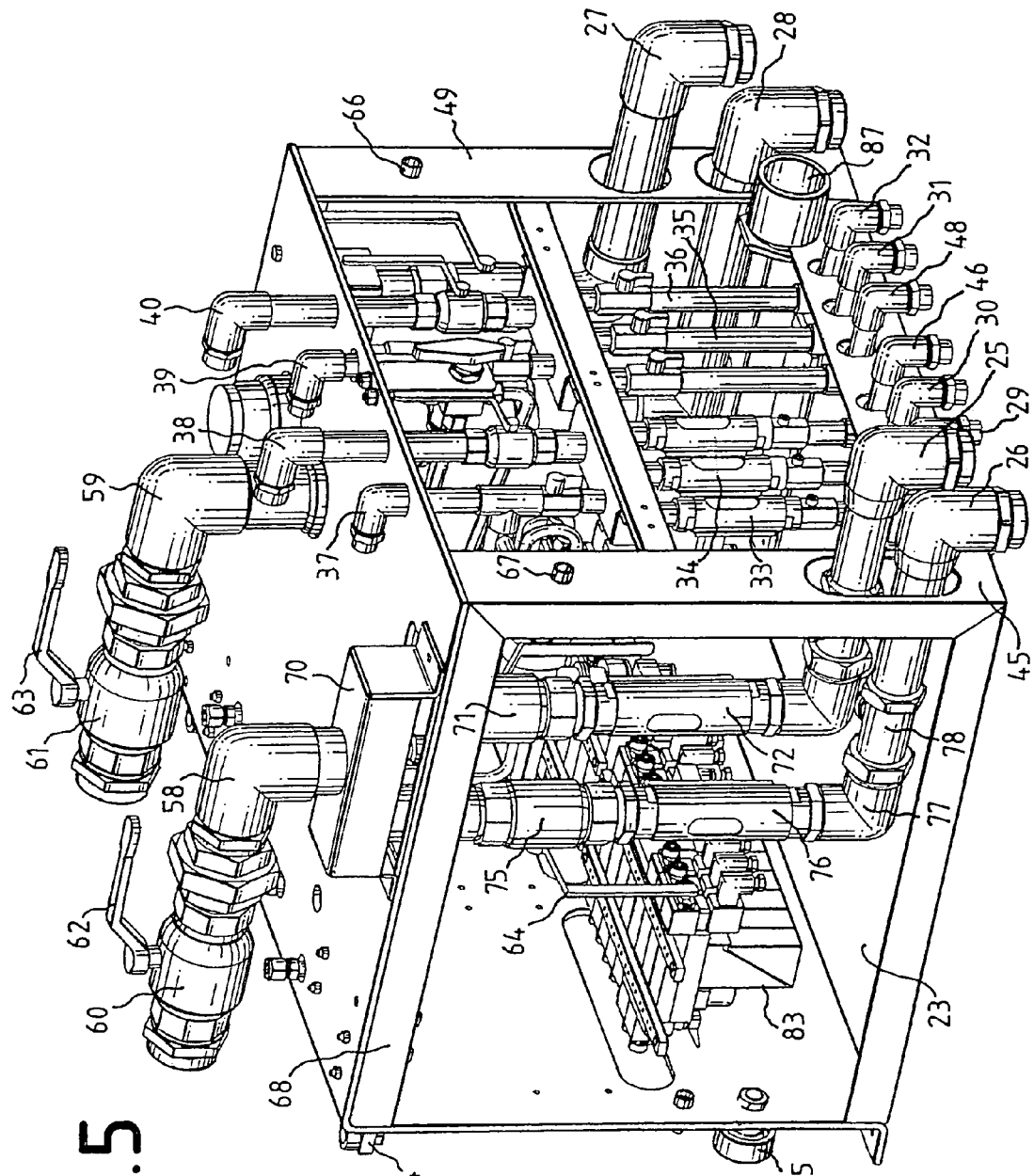
FIG. 5 perspective view of the module.

FIG. 5 shows the unit of FIGS. 2-4 in perspective view. On the left side can be seen the structural elements already known from FIG. 3 and 4, with the structural elements being rotated by 180 degrees in comparison to FIG. 3. On the right hand are depicted the structural elements shown in FIG. 4, while the structural elements depicted on the top of FIG. 5 are already shown in FIG. 3. In FIG. 5 can also be seen that several gas flow regulators 83 are disposed one next to the other. On metal sheets 45 and 49 are located connections 66, 67 for manometers. The shutoff lever 64 for the shutoff valve 75 is disposed above the gas flow regulators 83. Transport rollers are denoted by 84 and 85, which make possible displacing the module 1 along rails depicted in FIG. 6. The metal sheet 23 is a cover sheet through which no pipes or the like are guided.

Figure 6:
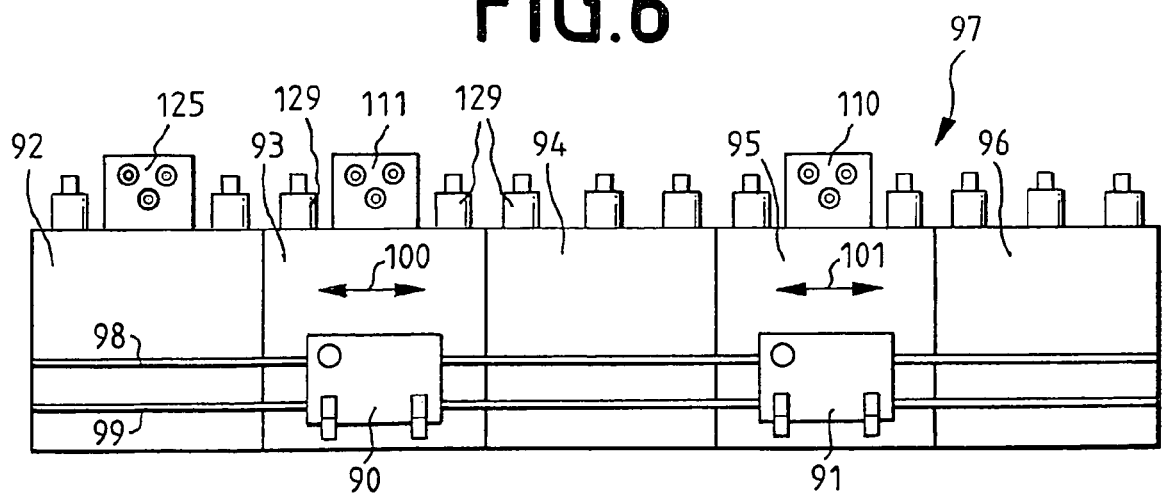
FIG. 6 coating installation with two modules.

FIG. 6 shows the cooperation of modules 90, 91 with a coating installation 97 comprised of several chambers 92 to 96.

Over the entire coating installation 97 extend two rails 98 and 99. The modules 90, 91 are coupled with the rails such that they can be moved in the directions of arrows 100, 101. The modules 90, 91 are suspended in rails 98, 99. The lines which are connected from the outside to the modules are located on the underside of the coating installation 97.

The views of the two modules shown in FIG. 6 are simplified. However, they correspond to the view according to FIG. 2.

In the representations according to FIG. 6 coating processes take place in chambers 93 and 95, while the chambers 92, 94, 96 serve as gas isolation chambers. Further chambers may be provided.

If in chamber 92 operation is started, while it is completed in chamber 93, the module 90 is moved from chamber 93 to chamber 92. Only the electric and mechanical connections important for the coating process must now be established, and chamber 92 can be started up. The side of a module 91 opposite chamber 95 has maximally the width of this chamber 95.

Cathode covering hoods are denoted by 110, 111 and 125, while 129 denotes pumping devices. Instead of on the top of the coating installation 97, these pumping devices 129 can also be disposed on a side wall of this installation 97.

In the following, two examples of the use of the energy and media connection according to the invention are described.

A so-called low-e layer is comprised, for example, of the layer sequence glass substrate —$TiO_2$—$ZnO$—$AG$—$NiCr$—$Si_3N_4$. To obtain this coating, in coating installation 97 following an interlock, three titanium cathodes are disposed in series: succeeding them is a gas isolation chamber, which is adjoined by a tin cathode. Succeeding a further gas isolation chamber is a silver cathode, which is followed by a nickel—chromium cathode. Then follows again a gas isolation chamber. Preceding the outward transfer through an interlock are disposed three silicon cathodes. Consequently, for the complete layer system overall nine cathodes and three gas isolation chambers are required. In addition, the gases required for the reactive processes must be supplied.

If, instead of a low-e layer, a simple solar control layer system is to be produced with the coating configuration 97, the conditions change fundamentally.

Such a solar control layer system is comprised, for example, of a special steel layer, on which titanium nitride is deposited. For this purpose a special steel cathode is necessary in front of the gas isolation chamber, which is followed by five titanium cathodes. Three of the available sputtering stations and two gas isolation chambers are not required for this purpose, they are switched idle. The shutting down herein takes place simply by disconnecting the electric, pneumatic and fluid-supplying lines by decoupling plug connections.

Another solar control system is comprised, for example of the layer sequence tin oxide—chromium—tin oxide. In this case four tin cathodes are arranged one after the other, followed by one gas isolation chamber. Succeeding it are two chromium cathodes, one gas isolation chamber and two further tin cathodes. Thus, eight cathodes and two gas isolation chambers are employed. One gas isolation chamber and one cathode are not required. Here also by decoupling the corresponding supply lines on the module, an adaptation to the new conditions can be attained.

Figure 7:
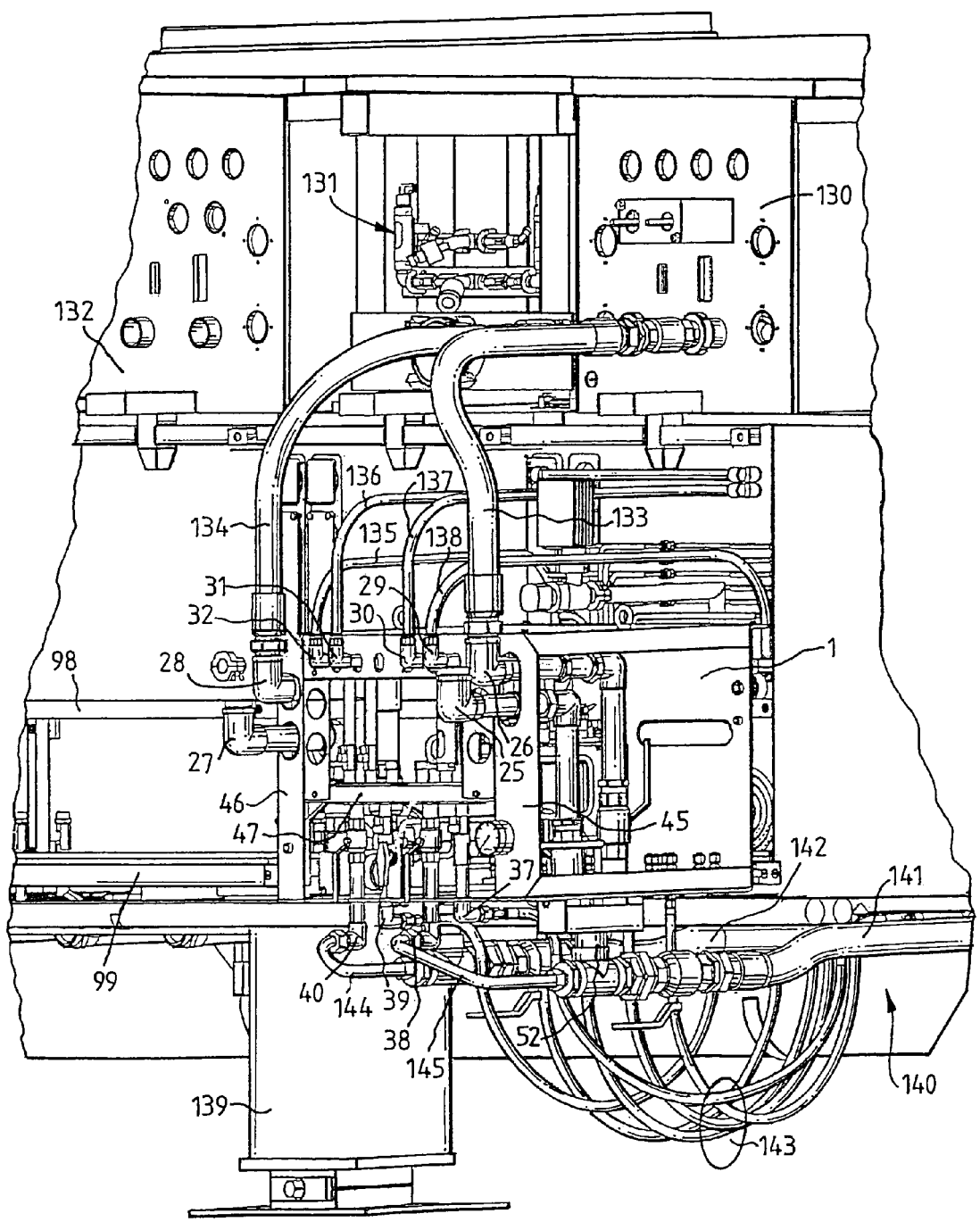
FIG. 7 enlarged segment from FIG. 6.

FIG. 7 shows a subregion of FIG. 6 in greater detail. This subregion shows a module 1 in a view substantially corresponding to the view according to FIG. 2, however laterally reversed. A cathode covering hood 130 is evident, beneath a first sputtering station, not shown in FIG. 7, is disposed. In addition, a pump compartment 131 is shown. A second sputtering station 132 is located to the left of this pump compartment 131. Beneath the pump compartment 131 are shown a cooling water return conduit 133 and a cooling water forward conduit 134 are depicted. The cooling hoses for the cooling of the environment of the cathode are denoted by 135 to 138. Beneath the rails 98, 99 on which the module 1 can roll, is disposed a base 139, which serves for supporting the coating installation.

Cooling fluid, power, gases and compressed air are supplied to the module 1 from the underside 140 of the coating installation. It can be seen in FIG. 7, that cooling fluid tubes 141, 142 and hoses 143 run there.

Figure 8:
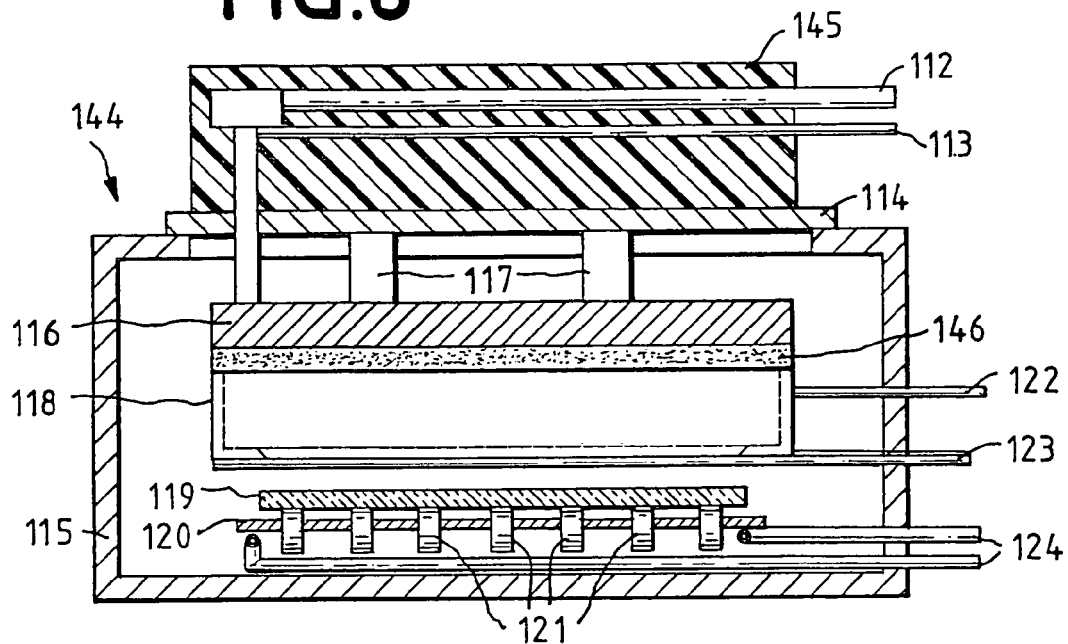
FIG. 8 cross section through a sputtering chamber with cooling system.

FIG. 8 shows in schematic representation a cross section through a sputtering chamber 144 comprising a cathode covering hood 145, which is disposed on an installation cover 114. A cooling water forward and return conduit is denoted by 112. Beneath this cooling water forward and return conduit 112 is disposed a connection 113 for a cathode voltage. With the installation cover 114 is connected a cathode mount 117, which holds a cathode 116 with target 146. An anode 118 is connected to an anode connection 122, with a supply line 123 for sputter gases being disposed beneath the anode. Again beneath the anode 118 is disposed a substrate 119, which can be for example a glass plate to be coated. By 120 is denoted a counter sputter metal sheet, which gains importance when the substrate 119 is moved away and the sputter installation is continued to be operated. The displacement of the substrate 119 takes place by means of transport rollers 121. Since the counter sputter metal sheet 120 is strongly heated during the sputtering process, it must be cooled. For this purpose a forward and return conduit 124 for a cooling fluid is provided. Consequently, the cathode itself is cooled as well as also its environment, with the cooling here being realized by the counter sputter metal sheet 120 and the anode 118.

Figure 9:
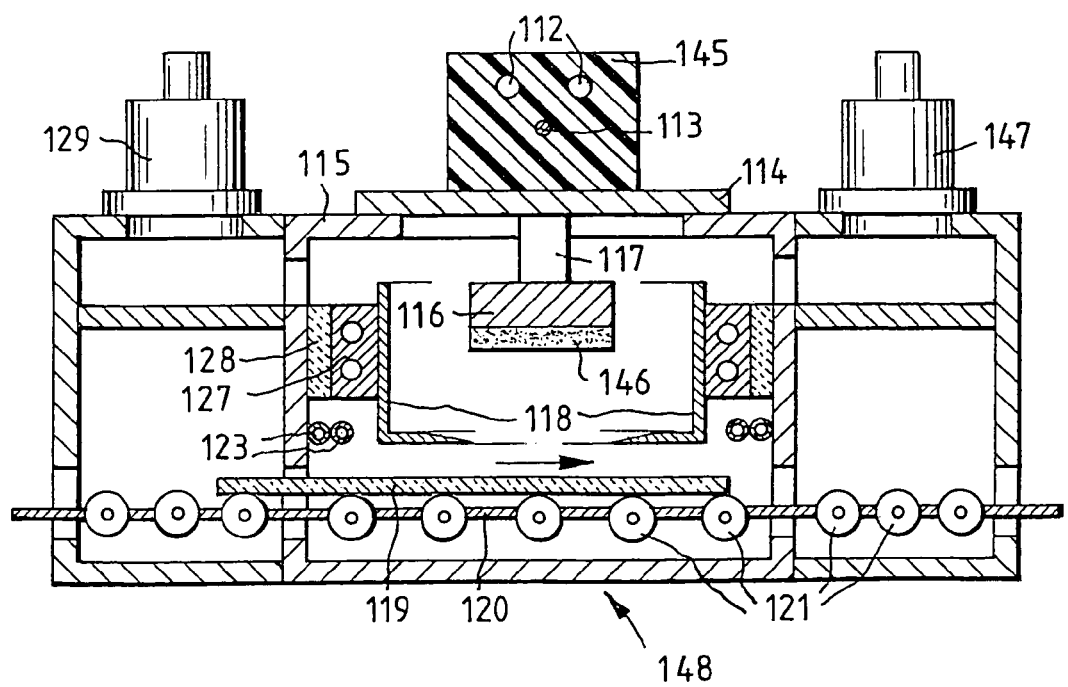
FIG. 9 longitudinal section through the sputtering chamber of FIG. 8.

FIG. 9 shows the configuration of FIG. 8 in a view rotated by 90 degrees. Evident herein are pumping devices 129, 147 and gas supply lines 123. It is, in addition, evident that the anode 118 is connected with a mount with cooling 127, and the mount 127, in turn, is connected via an insulation 128 with a wall of the sputtering chamber.

It is claimed:

1. A coating installation comprising several chambers and an energy and media connection, wherein each chamber is equipped with a sputter cathode individually assigned thereto and wherein a specified number for cooling medium lines and electric lines lead into the chamber, wherein the energy and media connection is developed as a module and comprises as many connections for cooling medium lines and electric lines as are required for the chamber with the most supply lines, wherein the coating installation comprises two rails extending over the entire coating installation, and wherein at least one module is coupled with said rails such that the at least one module can be transported from one chamber to another chamber.

2. The coating installation as claimed in claim 1, wherein the connections from the outside to the module and from the module to the chamber are detachable.

3. The coating installation as claimed in claim 1, developed in the shape of a cube, with the sides of the cube having substantially identical areas.

4. The coating installation as claimed in claim 1, wherein the power supply and the control are connected via pluggable connections.

5. The coating installation as claimed in claim 1, wherein the side of a module opposite a chamber has maximally the width of this chamber.

6. The coating installation as claimed in claim 1, wherein the module is developed as a framework structure.

7. The coating installation as claimed in claim 1, wherein the supply lines, which lead from the outside to the module, are disposed on the underside of the coating installation.

8. The coating installation as claimed in claim 1, wherein gas supply lines are provided.

9. The coating installation as claimed in claim 1, wherein measuring lines are provided.

* * * * *